United States Patent
Körner (10) Patent No.: US 7,170,356 B2
(45) Date of Patent: Jan. 30, 2007

(54) CIRCUIT WITH VARIABLE CAPACITANCE AND METHOD FOR OPERATING A CIRCUIT WITH VARIABLE CAPACITANCE

(75) Inventor: Heiko Körner, Söding (AT)

(73) Assignee: Infineon Technologies AG, Munich (DE)

( * ) Notice: Subject to any disclaimer, the term of this patent is extended or adjusted under 35 U.S.C. 154(b) by 28 days.

(21) Appl. No.: 11/065,340

(22) Filed: Feb. 23, 2005

(65) Prior Publication Data

US 2005/0206460 A1 Sep. 22, 2005

(30) Foreign Application Priority Data

Feb. 23, 2004 (DE) ............... 10 2004 008 701
Feb. 23, 2004 (DE) ............... 10 2004 008 706

(51) Int. Cl.
*H03B 5/12* (2006.01)

(52) U.S. Cl. .................. 331/117 R; 331/117 FE; 331/177 R; 331/177 V (58) Field of Classification Search .......... 331/36 C, 331/117 R, 117 FE, 117 D, 177 R, 177 V
See application file for complete search history.

(56) References Cited

U.S. PATENT DOCUMENTS 6,445,257 B1 * 9/2002 Cox et al. ............... 331/117 R
6,509,805 B2   1/2003 Ochiai
6,563,392 B2 * 5/2003 Gomez et al. ......... 331/117 FE
2002/0008593 A1   1/2002 Gomez et al.
2005/0088249 A1   4/2005 Oehm et al.

FOREIGN PATENT DOCUMENTS

DE    102 09 517 A1    6/2003

* cited by examiner

*Primary Examiner*—David Mis
(74) *Attorney, Agent, or Firm*—Maginot, Moore & Beck (57) ABSTRACT

A circuit with variable capacitance includes a capacitance, wherein the capacitance includes a first partial capacitance and a second partial capacitance connected in parallel to the first partial capacitance, wherein a capacitance value of the first partial capacitance depends on a first bias of the partial capacitance, and a capacitance value of the second partial capacitance depends on a second bias of the second partial capacitance. The circuit with variable capacitance further includes a unit for providing the first bias and the second bias. With such a circuit with variable capacitance, it is possible to achieve a more linear and flatter characteristic tuning curve of the circuit with variable capacitance as compared to a conventional circuit with variable capacitance in a simple way.

28 Claims, 8 Drawing Sheets

CIRCUIT WITH VARIABLE CAPACITANCE AND METHOD FOR OPERATING A CIRCUIT WITH VARIABLE CAPACITANCE

CROSS-REFERENCE TO RELATED APPLICATIONS

This application claims priority from German Patent Applications No. 10 2004 008 706.7, filed on Feb. 23, 2004, and No. 10 2004 008 701.6, filed on Feb. 23, 2004, which are incorporated herein by reference in their entirety.

BACKGROUND OF THE INVENTION

1. Field of the Invention

The present invention relates to a circuit with variable capacitance and a method for operating a circuit with variable capacitance, and, in particular, the present invention relates to an electronic circuit with variable capacitance whose transition behaviour between a minimum and a maximum saturation value is variable.

2. Description of the Related Art

Figure 4:
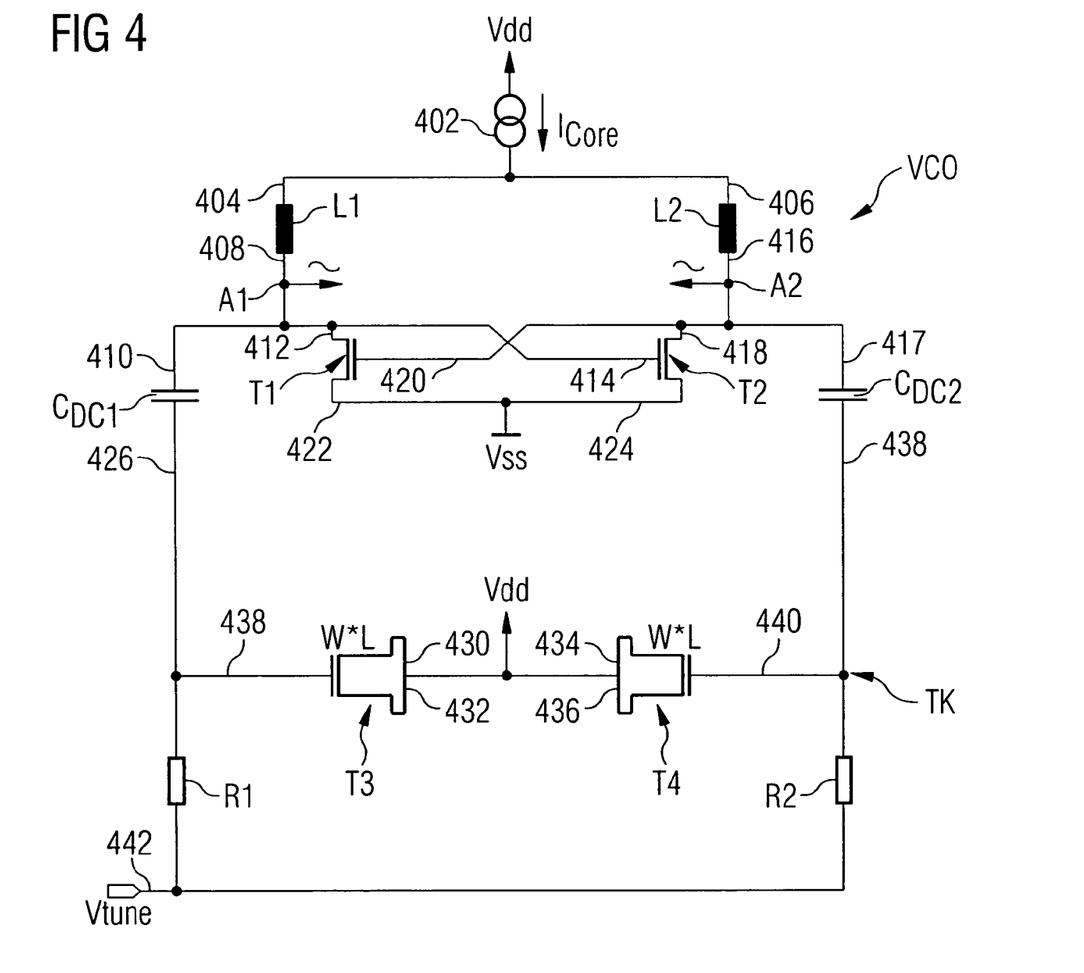
FIG. 4 shows a circuit diagram of a conventional oscillator circuit.

A conventional voltage controlled oscillator (VCO) in most cases has one or more characteristic tuning curves, wherein such a characteristic curve represents the relation between an applied tuning voltage Vtune and an oscillation frequency. An exemplary oscillator circuit for a conventional voltage controlled oscillator is illustrated in FIG. 4. The voltage controlled oscillator VCO includes a supply voltage terminal Vdd connected to a first terminal 404 of a first inductance L1 and a second terminal 406 of a second inductance L2 via a current source 402. The current source 402 is designed to impress the supply current $I_{core}$ on the voltage controlled oscillator VCO. The first inductance L1 further includes a second terminal 408 electrically connected to a first electrode 410 of a first DC decoupling capacitor $C_{DC1}$, a first terminal 412 of a first transistor T1 and a control terminal of a second transistor T2. In addition, a second terminal 416 of the second inductance L2 is electrically connected to a first electrode 417 of a second DC decoupling capacitor $C_{DC2}$, a first terminal 418 of the second transistor T2 and a control terminal 420 of the first transistor T1. A second terminal 422 of the first transistor T1 and a second terminal 424 of the second transistor T2 are electrically connected to a ground potential terminal Vss. Furthermore, a second electrode 426 of the first DC decoupling capacitor $C_{DC1}$ is electrically connected to a control terminal 428 of a first auxiliary transistor T3. A first terminal 430 and a second terminal 432 of the first auxiliary transistor T3 is electrically connected to a first terminal 434 and a second terminal 436 of a second auxiliary transistor T4 and the supply voltage terminal Vdd. Furthermore, a second electrode 438 of the second DC decoupling capacitor $C_{DC2}$ is electrically connected to a control electrode 440 of the second auxiliary transistor T4. Furthermore, a control voltage terminal 442 for a control voltage Vtune is electrically connected to the control terminal 428 of the first auxiliary transistor T3 and the control terminal 440 of the second auxiliary transistor T4 via the decoupling resistors R1 and R2.

The voltage controlled oscillator VCO further comprises a first tap point A1 connected to the second terminal 408 of the first inductance L1, and a second tap point A2 connected to the second terminal 416 of the second inductance L2. Between the first tap point A1 and the second tap point A2, a voltage may be tapped off which may be output as differential output signal of the voltage controlled oscillator.

If a supply voltage is now applied between the supply voltage terminal Vdd and the ground potential terminal Vss, the oscillator circuit VCO illustrated in FIG. 4 settles such that either the first transistor T1 or the second transistor T2 is connected through. It may be assumed here that the serially connected capacitances $C_{DC2}$, $C_{DC1}$ and the auxiliary transistors T3 and T4 acting as voltage-dependent capacitances (varactors) may be regarded as a single total capacitance. If the first transistor T1 is connected through, the voltage controlled oscillator may thus be said to form an oscillating circuit between the supply voltage terminal Vdd and the ground potential terminal Vss with the second inductance L2 and the total capacitance, the frequency of the circuit being substantially adjustable by the total capacitance. The active area of the transistor thus has the width W and the length L. By applying the tuning voltage Vtune at the gate, the charge carrier situation within this active area as well as above and below changes. The result is a plate capacitor, so to speak, whose plate distance is changed by the control voltage (=tuning voltage) Vtune.

As a further interpretation of the circuit illustrated in FIG. 4, it is to be noted that the inductances L1 and L2 and the series connection of the right and left varactors (considering parasitic effects) may be regarded as only pertinent to an oscillating circuit. In such an oscillating circuit, there is then a high AC current whose magnitude is determined by its quality. The losses in this oscillating circuit are compensated in a phase-correct way by the smaller current $I_{core}$, for which the cross-coupled transistor pair T1 and T2 is responsible.

Furthermore, a current flow to the ground potential terminal Vss via the first transistor T1 is induced, also via the first inductance L1. If a potential at the first tap point A1 reaches a predetermined threshold by the current flowing across the first inductance L1, it is connected through via the control terminal 414 of the second transistor T2, resulting in an oscillating circuit between the supply voltage terminal Vdd and the ground potential terminal Vss via the first inductance L1 and the total capacitance. The oscillation frequency is again substantially determined by a capacitance value of the total capacitance. This capacitance value of the total capacitance may be adjusted by the tuning voltage (=adjusting voltage) which may be applied at the tuning voltage terminal 442. A capacitance value of the total capacitance may, in particular, be varied due to the fact that the capacitance of the auxiliary transistors T3 and T4 acting as varactors may be changed by the tuning voltage Vtune. The auxiliary transistors T3 and T4, which are preferably MOS transistors, are used such that the gate terminal acts as first electrode, the oxide between the gate terminal (=control terminal) and the substrate acts as dieletric and the (short-circuited) drain (=first terminal) and source terminals (=second terminal) act as second electrode of the varactor. Due to the fact that, using a variable voltage between thus connected auxiliary transistors T3 and T4, a channel width W/L of the channel forming between the gate terminal and the drain and source terminals is changeable, the capacitance value of the auxiliary transistors T3 and T4 acting as varactors may also be changed, resulting together in a change of the capacitance value of the total capacitance.

The more linear a relation between an applied tuning voltage and an oscillator frequency, the more favourable are its properties, for example when used in a phase locked loop (PLL). Particularly a voltage controlled oscillator VCO with constant inductance, as the inductances L1 and L2 illustrated in FIG. 4, requires a varactor to shift the resonant frequency according to the applied tuning voltage. As discussed above, particularly MOS transistor capacitances are used in voltage controlled oscillators produced in integrated circuit technology (such as in CMOS technology). For this, mainly the voltage-dependent capacitance between the gate and substrate (i.e. the drain and source terminals) is used.

Figure 5A:
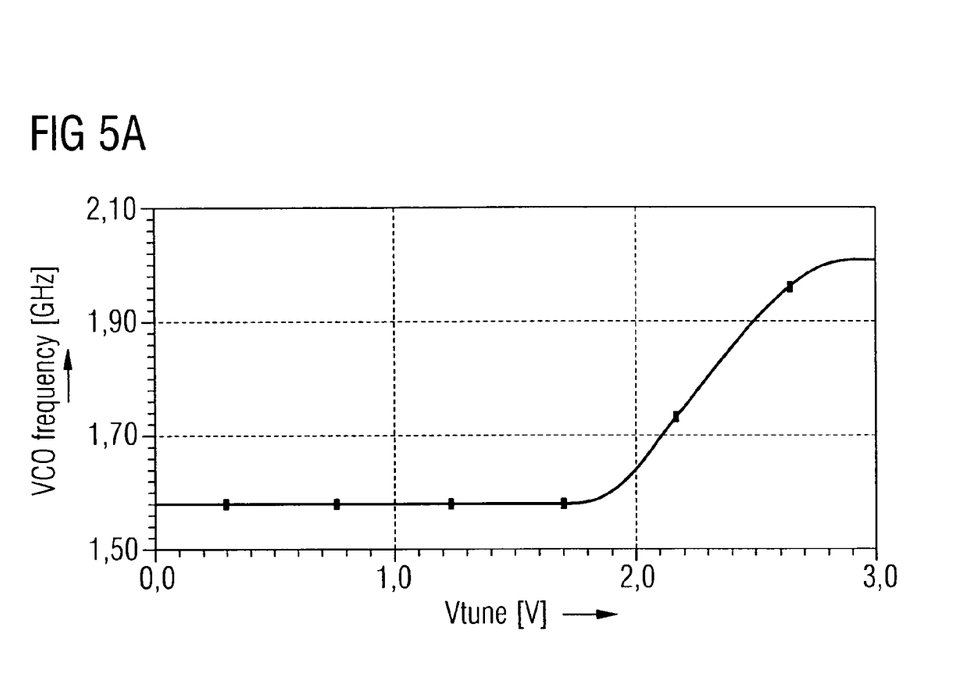
FIGS. 5A and 5B show diagrams of the oscillator frequency and the frequency/voltage sensitivity of the conventional oscillator circuit as a function of an applied tuning voltage.
Figure 5B:
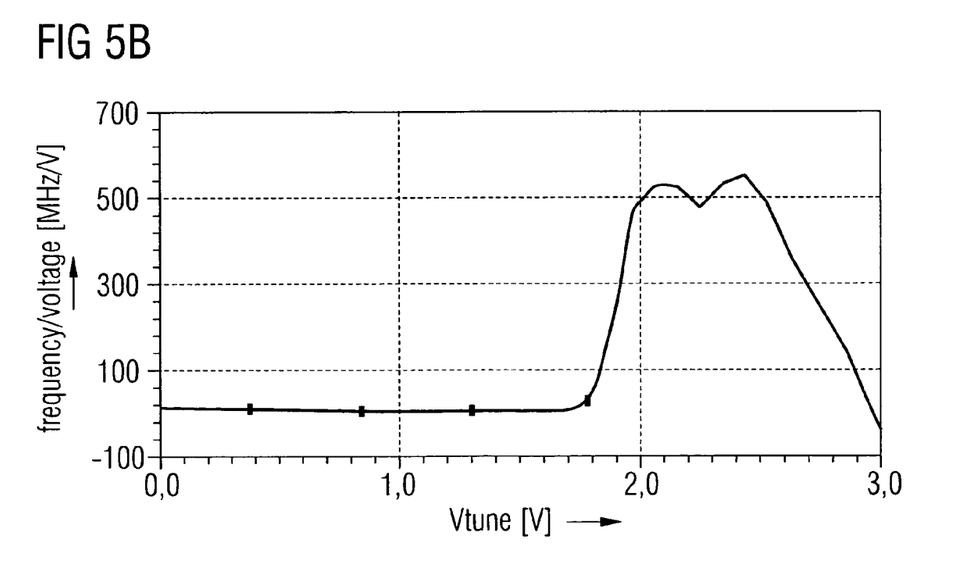

However, such a varactor element consisting of the auxiliary transistors T3 and T4 illustrated in FIG. 4 have the disadvantage that the characteristic tuning curve generated therefrom is relatively short and thus steep in the transition area between the minimum and the maximum saturation value. Such a characteristic curve is shown in FIG. 5A, in which the VCO frequency is plotted as a function of an applied tuning voltage Vtune. This results in a sensitive transition area of the frequency/voltage characteristic, as illustrated in FIG. 5B. If a longer, i.e. flatter, tuning area with little curve inclination is to be covered, this may be done with many individual curves between which there must be constant switching. However, such a behaviour has the disadvantage that considerable hardware expenditures are necessary in the amplifier due to the necessary switching between the individual tuning curves, whereby it is not possible to produce such a voltage control oscillator at a low price.

Such problems concerning the steep capacitance behaviour of the capacitance as a function of the tuning voltage also occur in other fields of application, such as measuring technology where a maximally linear behaviour of the individual electronic devices is desirable over the entire dynamic range of measuring devices.

SUMMARY OF THE INVENTION

It is an object of the present invention to provide a circuit with variable capacitance and a method for operating a circuit with variable capacitance which allow a variable capacitance so that a more linear and flatter characteristic tuning curve may be provided as compared to a characteristic tuning curve of a conventional circuit. Further, it is an object of the present invention to provide a way to make a steepness of the characteristic tuning curve of the circuit variable. Further, it is the object of the present invention to provide an oscillator circuit and a method for operating an oscillator circuit, so that a variable adjustability of an output frequency of the oscillator circuit is made possible, and/or so that a more linear and flatter characteristic tuning curve of an oscillator circuit is provided as compared to a characteristic tuning curve of a conventional oscillator circuit. Further, it is an object of the present invention to provide a way to make a steepness of the characteristic tuning curve of the oscillator circuit variable.

Further, it is an object of the present invention to be able to provide the more linear and flatter characteristic tuning curve in a simple and cost-efficient way.

In accordance with a first aspect, the present invention provides a circuit with variable capacitance having: a capacitance, wherein the capacitance includes a first partial capacitance and a second partial capacitance connected in parallel to the first partial capacitance, wherein a capacitance value of the first partial capacitance depends on a first bias of the first partial capacitance, and a capacitance value of the second partial capacitance depends on a second bias of the second partial capacitance; and a unit for providing the first bias and the second bias.

In accordance with a second aspect, the present invention provides a method for operating a circuit with variable capacitance, wherein the circuit with variable capacitance includes a capacitance having a first partial capacitance and a second partial capacitance connected in parallel to the first partial capacitance, wherein a capacitance value of the first partial capacitance depends on a first bias of the first partial capacitance, and a capacitance value of the second partial capacitance depends on a second bias of the second partial capacitance, and a unit for providing the first bias and the second bias, the method having the steps of: providing the first bias and the second bias; and tapping off a voltage dropping at the capacitance of the circuit with variable capacitance to output the same as output signal of the circuit with variable capacitance.

In accordance with a third aspect, the present invention provides a computer program with program code for performing the above-mentioned method, when the program runs on a computer.

In accordance with a fourth aspect, the present invention provides an oscillator circuit having an inductance; a capacitance connectable in series to the inductance, wherein the capacitance includes a first partial capacitance and a second partial capacitance connected in parallel to the first partial capacitance, wherein a capacitance value of the first partial capacitance depends on a first bias of the first partial capacitance, and a capacitance value of the second partial capacitance depends on a second bias of the second partial capacitance; and a unit for providing the first bias and the second bias.

In accordance with a fifth aspect, the present invention provides a method for operating an oscillator circuit, wherein the oscillator circuit includes an inductance, a capacitance connectable in series to the inductance, the capacitance having a first partial capacitance and a second partial capacitance connected in parallel to the first partial capacitance, wherein a capacitance value of the first partial capacitance depends on a first bias of the first partial capacitance, and a capacitance value of the second partial capacitance depends on a second bias of the second partial capacitance, and a unit for providing the first bias and the second bias, the method having the steps of providing the first bias and the second bias; tapping off a voltage dropping at the capacitance of the oscillator circuit to output the same as output signal of the oscillator circuit.

In accordance with a sixth aspect, the present invention provides a computer program with program code for performing the above-mentioned method, when the program runs on a computer.

The present invention is based on the finding that connecting in parallel a first partial capacitance whose capacitance value depends on a first bias with a second partial capacitance whose capacitance value depends on a second bias creates the possibility to achieve a continuous extension of the characteristic tuning curve without complex switching. This is particularly because the selection of the first bias with respect to the second bias may preferably be performed such that the first bias differs from the second bias. By connecting the first partial capacitance and the second partial capacitance in parallel, an overlapping of the transition areas of the capacitance characteristic of the first partial capacitance with the capacitance characteristic of the second partial capacitance is achieved. If different biases are used between the used partial capacitances, there is an offset of the transition areas of their capacitance characteristics of the individual partial capacitances, resulting in flattening the capacitance behaviour of the total capacitance. This results in avoiding the switching of various characteristic tuning curves to achieve an extension and flattening of the characteristic tuning curves. Preferably, the first partial capacitance may include two auxiliary capacitances connected in series with a first tap point in-between, and the second partial capacitance may include two further auxiliary capacitances connected in series with a second tap point in-between, wherein the first bias is defined by a potential difference between the first tap point and a ground potential terminal, and the second bias is defined by a potential difference between the second tap point and the ground potential terminal.

With such a design of the first partial capacitance and the second partial capacitance, the first partial capacitance may thus be biased with a first bias, and the second partial capacitance may be biased with a second bias in a simple way. If, for example, the first tap point and the second tap point are connected to each other via an ohmic resistor, and the first tap point is electrically connected to a support voltage terminal, and the second tap point is connected to a potential corresponding to the potential of the ground potential terminal, this results simply in a first bias at the first tap point differing from the second bias at the second tap point.

If the auxiliary capacitances are preferably designed as MOS transistors, analogously to the conventional method, and if, for example, a tuning voltage is applied to the partial capacitances, the capacitance characteristic of the partial capacitances has a steeper curve in a defined tuning voltage interval. Outside this tuning voltage interval, the partial capacitances then, for example, assume saturation values and are nearly independent of the tuning voltage in such areas of the tuning voltage. Due to the fact that now the biases of the individual partial capacitances are "offset" with respect to each other, a total capacitance of the electronic circuit may thus be constructed, by the overlay and the shift as well as the parallel connection of the individual partial capacitances, which has a longer and flatter capacitance value characteristic as compared to the capacitance characteristic of the individual partial capacitances.

The present invention thus offers the advantage to avoid a complicated and thus cost-intensive switching between individual characteristic tuning curves by a simple circuit engineering measure. The result of the resulting overlay is a significantly flatter and more linear characteristic capacitance curve than is the case for a conventional characteristic capacitance curve.

Furthermore, it is, for example, possible to change a voltage difference between the first tap point and the second tap point by varying the current flow through an electric resistor connecting the first tap point to the second tap point. This is particularly because the voltage dropping at the ohmic resistor between the first tap point and the second tap point is proportional to the current flow through this ohmic resistor. Thus if, for example, the current flow through the ohmic resistor is increased or the resistance of the resistor is increased, the voltage difference between the first tap point and the second tap point also increases resulting, in turn, in an increase of the mutual offset of linear areas (i.e. the transition areas) of the individual partial capacitances. By a variation of the offset of the linear partial areas of the individual partial capacitances, it is thus possible to change the steepness of the characteristic tuning curve with respect to a variation of the tuning voltage.

Such an electronic circuit thus offers the further advantage to provide, in a simple manner, a linearization of the characteristic tuning curve of the electronic circuit, in which the steepness of the characteristic tuning curve is also variable and in which switching between individual characteristic curves is avoided. This results in an improved characteristic of the electronic circuit and thus makes the inventive electronic circuit usable in a considerably broader field of application as compared to a corresponding conventional electronic circuit.

BRIEF DESCRIPTION OF THE DRAWINGS

Preferred embodiments of the present invention will be explained in the following with respect to the accompanying drawings, in which.

DESCRIPTION OF THE PREFERRED EMBODIMENTS

In the following description of the preferred embodiments of the present invention, equal or similar reference numbers are used for elements illustrated in the various drawings and acting similarly, wherein a repeated description of these elements is omitted.

Figure 1A:
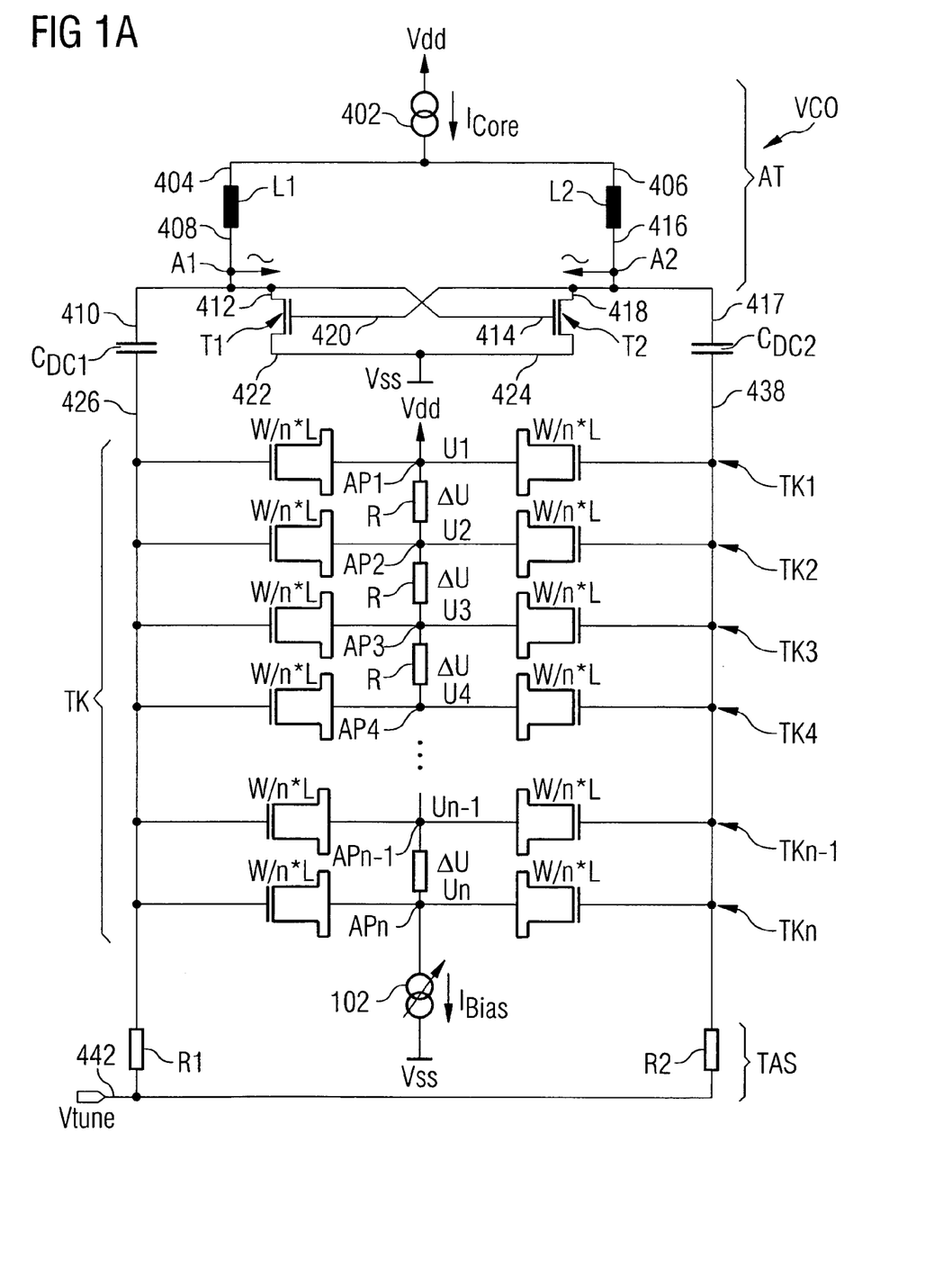
FIGS. 1A and 1B show circuit diagrams of embodiments of an exemplary oscillator circuit.

FIG. 1A shows a circuit diagram of an embodiment of the exemplary oscillator circuit. The embodiment of the exemplary oscillator circuit essentially corresponds to the conventional oscillator circuit illustrated in the circuit diagram in FIG. 4. Unlike the conventional oscillator circuit illustrated in FIG. 4, the circuit diagram of the embodiment of the exemplary oscillator circuit according to FIG. 1A shows a plurality of partial capacitances TK1, TK2, TK3, TK4, . . . , TKn−1, TKn, which, each for itself, are constructed analogously to the partial capacitance TK illustrated in FIG. 4. The individual partial capacitances thus again comprise two auxiliary transistors each whose respective drain and source terminals are electrically connected to each other, whereby a tap point AP is provided between the two auxiliary transistors for each partial capacitance. It is to be noted that, for example, the first partial capacitance TK1 provides a first tap point AP1 which may be provided with the first bias U1, wherein, in the circuit diagram illustrated in FIG. 1A, the first bias corresponds to the supply voltage of the supply voltage terminal Vdd.

Preferably, the individual auxiliary transistors of the partial capacitances each have a ratio of a channel width W/n to a channel length L which is reduced by the factor n compared to the conventionally used auxiliary transistors T3 and T4. The result is that, by a plurality of small individual matching transistors as auxiliary transistors, a good adaptation behaviour with, at the same time, little space requirements on the semiconductor (substrate) of the integrated circuit is necessary.

The oscillator circuit illustrated in FIG. 1A is thus composed of an active part AT with coil, the DC decoupling capacitances $C_{DC1}$ and $C_{DC2}$, the partial capacitances TK and the tuning voltage control TAS via the decoupling resistors R1 and R2 (AC decoupling).

Furthermore, the first tap point AP1 of the first partial capacitance TK1 is connected, via an ohmic resistor R, to a second tap point AP2 which, in turn, forms the connection point of the drain and source terminals of the auxiliary transistors of the second partial capacitance TK2. The second tap point AP2, in turn, is connected, through an ohmic resistor R, to a third tap point AP3 which forms a connection point of drain and source terminals of the auxiliary transistors of the third partial capacitance TK3. This third tap point AP3, in turn, is conductively connected, with an ohmic resistor R, to a fourth tap point forming a connection point of drain and source terminals of the auxiliary transistors of the fourth partial capacitance TK4. This may be continued for any number of partial capacitances, wherein the present case assumes n partial capacitances. The last connection is thus a tap point Apn−1 of the partial capacitance TKn−1 connected to the $n^{th}$ tap point Apn of the $n^{th}$ partial capacitance TKn via the ohmic resistor R. The $n^{th}$ tap point Apn is further connected to the ground potential terminal Vss via the bias current source 102, so that the current source 102 impresses the bias current $I_{bias}$ on the $n^{th}$ tap point Apn. As the bias current $I_{bias}$ may be supplied neither via the auxiliary transistors of the $n^{th}$ partial capacitance TKn nor via the further auxiliary transistors of the upstream partial capacitances TK1 through TKn−1, the result is that the bias current $I_{bias}$ is taken from the supply voltage terminal Vdd.

Considering the design of the ohmic resistors R through which the respective tap points of partial capacitances are connected to the adjacent tap points of the adjacent partial capacitances, this results in a voltage difference ΔU, whereby the voltage U2 results at the second tap point AP2 of the second partial capacitance TK2, the voltage U3 results at the third tap point AP3 of the third partial capacitance TK3, the voltage U4 results at the fourth tap point AP4 of the fourth partial capacitance TK4, . . . , the voltage Un−1 results at the n−$1^{th}$ tap point APn−1 of the n−$1^{th}$ partial capacitance TKn−1, and the voltage Un results at the $n^{th}$ tap point Apn of the $n^{th}$ partial capacitance TKn. This ensures that the respective tap points of the individual partial capacitances have different potentials (i.e. biases with respect to the potential of the ground potential terminal), whereby there is a shift of the capacitance characteristic of the individual partial capacitances, as described in more detail in the following.

Figure 1B:
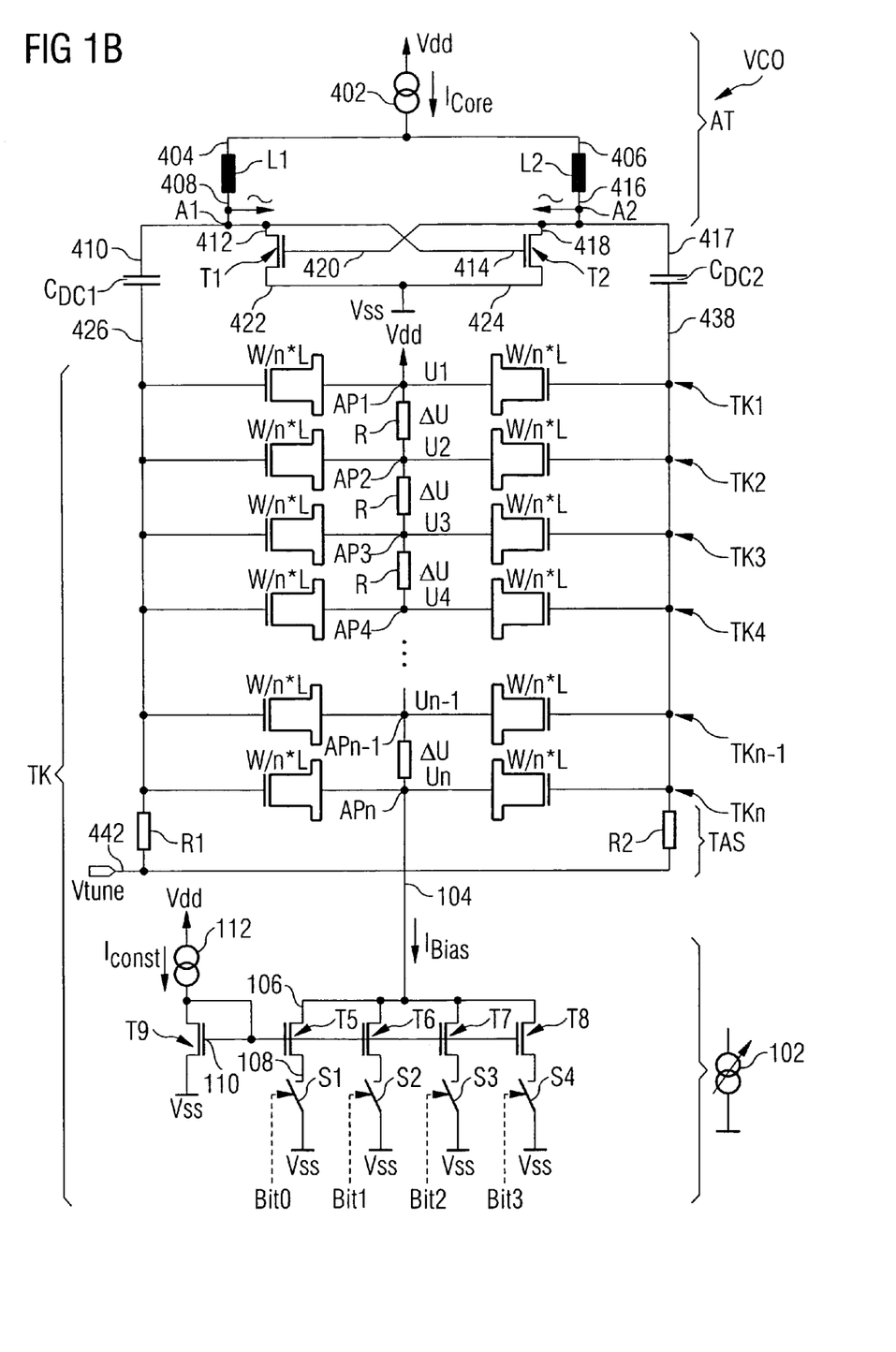

FIG. 1B shows a further optimized embodiment of the embodiment illustrated in FIG. 1A. The oscillator circuit VCO includes means for changing the defined voltage relationship in the form of a current source 102 which can provide a changeable bias current $I_{bias}$ via the ohmic resistors R. The current source 102 consists of an input 104 connected to the $n^{th}$ tap point Apn. Further, the controlled current source 102 includes a first auxiliary transistor T5 with a first controlled terminal 106 and a second controlled terminal 108, wherein the first controlled terminal 106 of the auxiliary transistor T5 is connected to the input terminal 104 of the current source 102, and the second controlled terminal 108 of the first auxiliary transistor T5 is connected to the ground potential terminal Vss via a switch S1. The switch S1 may, for example, be closed or opened by switch control means not illustrated in FIG. 1B, wherein the switch control means may, for example, be controlled depending on a bit storable in a memory. If, for example, the value of the bit has the logical state "1", the switch may be closed, while the switch is open, when the bit has the logic state "0".

The current source 102 may further include a second auxiliary transistor T6, a second switch S2, a third auxiliary transistor T7, a third switch S3, a fourth auxiliary transistor T8 and a fourth switch S4. A connection of the second auxiliary transistor T6 to the second switch S2, of the third auxiliary transistor T7 to the third switch S3, and of the fourth auxiliary transistor T8 to the fourth switch S4 is formed analogously to the connection of the first auxiliary transistor T5 to the first switch S1 and the ground potential terminal Vss. Furthermore, the thus connected auxiliary transistors T6, T7, T8 with the switches S2, S3 and S4 are connected in parallel to the auxiliary transistor T5 with the first switch S1. Furthermore, the auxiliary transistors, T5, T6, T7 and T8 each have a control terminal 110, wherein the individual control terminals 110 of said transistors are connected to each other and to a control terminal 110 of a fifth auxiliary transistor T9. The fifth auxiliary transistor T9, in turn, comprises a first controlled terminal 106 and a second controlled terminal 108, wherein the first controlled terminal 106 is connected to the supply voltage terminal Vdd via a current source 112 providing a constant current $I_{const}$. The second terminal 108 of the ninth transistor T9 is further connected to the ground potential terminal Vss. In addition, the first terminal of the fifth auxiliary transistor T9 is connected to the control terminal 110 of the fifth auxiliary transistor T9.

With a thus designed current source 102, it is now possible to provide a different (i.e. stepped) current flow of the bias current $I_{bias}$ by closing a different number of the switches S1 to S4. This can be explained, in particular, by the fact that the auxiliary transistors T5 through T8 act as resistors, wherein, by closing the switches S1 through S4, a different number of the resistors formed by the transistors is connected in parallel, whereby the total resistance between the input terminal 104 and the current source 102 and the ground potential terminal Vss may be reduced stepwise. Thus, by the above connection of the fifth auxiliary transistor T9 with one of the auxiliary transistors T5 through T8, respectively, a so-called current mirror is formed which acts as current source, as it is known. A current source with a stepped current strength may thus be formed at the input terminal 104 of the current source 102 by connecting the transistors T5 through T8 in parallel.

With a thus stepped bias current $I_{bias}$, a difference voltage $\Delta U = I_{bias} \cdot R$ may be formed between the individual tap points AP1 through Apn. Alternatively, the difference voltage ΔU may also be achieved by changing also the resistors R either individually or all together with constant bias current $I_{bias}$. A voltage difference ΔU resulting herefrom thus has the same effect as a voltage difference ΔU induced by a change of the bias current $I_{bias}$.

Figure 2A:
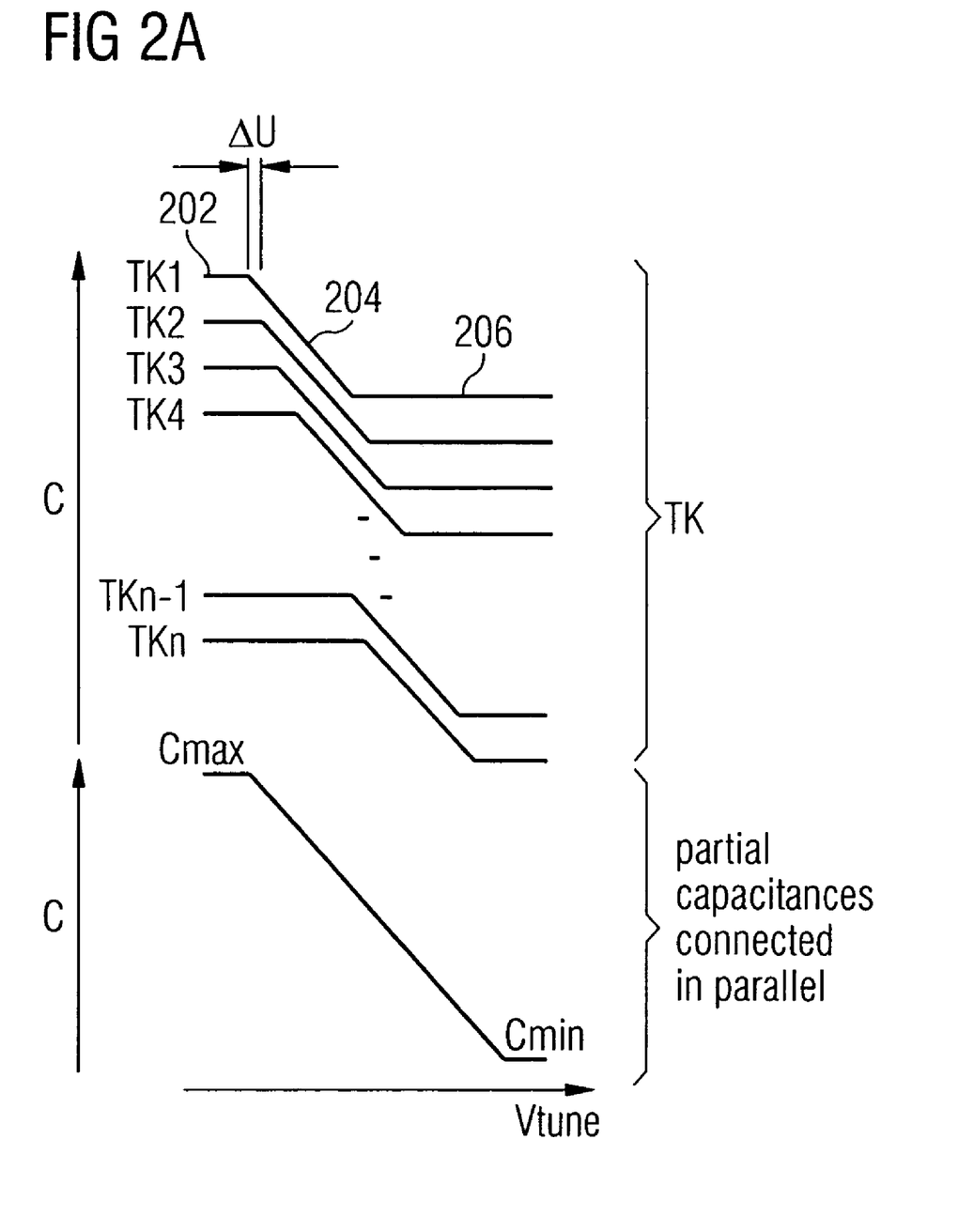
FIGS. 2A and 2B show diagrams with a representation of the total capacitance resulting from the partial capacitances.

FIG. 2A shows a diagram of the capacitance value curve of the individual partial capacitances TK and a resulting total capacitance curve of the partial capacitances connected in parallel. The upper part diagram of FIG. 2A shows the capacitance value curve of the individual partial capacitances TK1, TK2, TK3, TK4, . . . , TKn−1, TKn, wherein it becomes apparent that each of the partial capacitances comprises a maximum saturation area 202, a linear area 204 and a minimum saturation area 206 illustrated in the upper part diagram of FIG. 2 by way of example in the capacitance value curve of the first partial capacitance TK1. The "spread" capacitance value curve of the individual partial capacitances illustrated in the upper part diagram in FIG. 2A results from the fact that each of the partial capacitances, as illustrated in FIG. 1A, has a bias which is offset by a voltage difference ΔU with respect to the bias of the adjacent partial capacitance. The result of a vertical aggregation (summation) of the capacitance values of the individual partial capacitances is the capacitance curve of the partial capacitances connected in parallel, as illustrated in the lower part diagram in FIG. 2A as a function of the tuning voltage Vtune. The capacitance curve 208 of the partial capacitances connected in parallel is shown to have a linear curve in a considerably larger tuning voltage interval as compared to the capacitance curve of each of the individual partial capacitances.

Figure 2B:
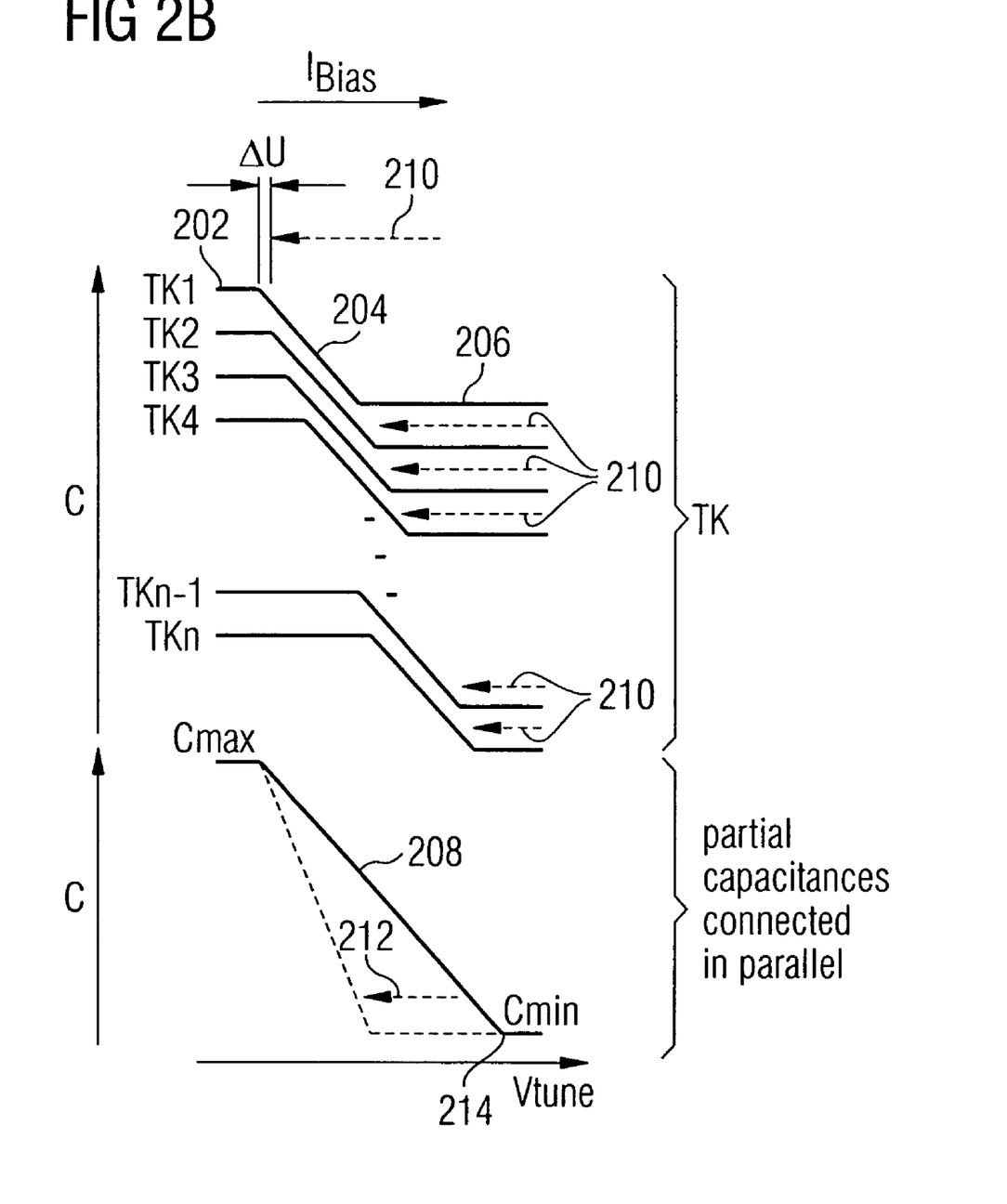

FIG. 2B shows a capacitance curve as it results when using a circuit according to FIG. 1B. FIG. 2B illustrates how a change of the defined voltage relationship, i.e. the formed voltage difference ΔU between the individual tap points AP1 through Apn of the oscillator circuit VCO illustrated in FIG. 1B, influences the whole, i.e. the whole characteristic tuning curve 208. If the bias current $I_{bias}$ increases, the voltage difference ΔU increases and the characteristic curves of the individual partial capacitances TK1 through TKn are offset further against each other with respect to the tuning voltage Vtune. Conversely, a decrease of the bias current $I_{bias}$ means a decrease of the voltage difference ΔU, as it is illustrated, for example, by the dashed arrows 201. Such a decrease of the difference voltage ΔU thus results in an increase of the steepness of the entire characteristic tuning curve 208, which results from a shift 212 of the point 214 at which the minimum total capacitance Cmin is reached.

Figure 3A:
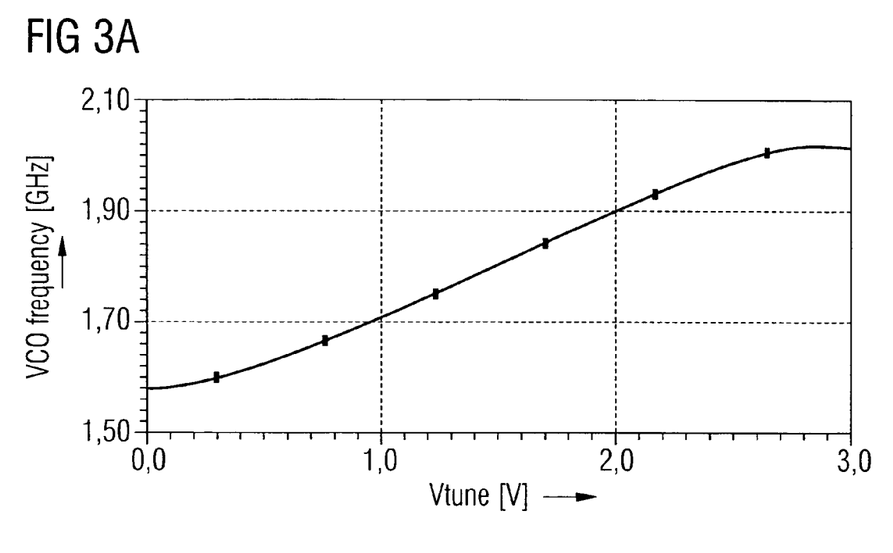
FIG. 3A to 3C show diagrams of the oscillator frequency and the frequency/voltage sensitivity as a function of an applied tuning voltage.
Figure 3B:
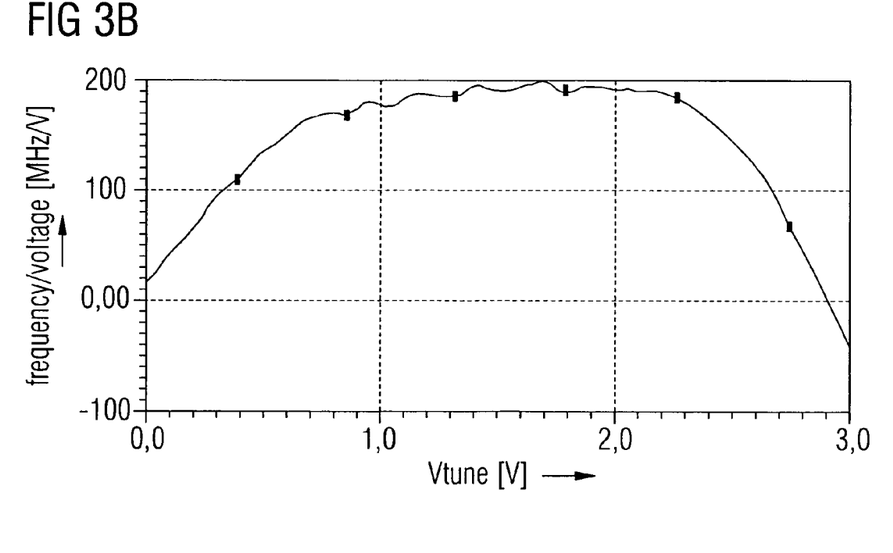

FIG. 3A shows the oscillator frequency of an oscillator designed according to FIG. 1A as a function of the tuning voltage Vtune, wherein it is apparent that the resulting frequency of the oscillator is now considerably less sensitive with respect to a variation of the tuning voltage Vtune, which results from the flatter course of the curve illustrated in FIG. 3A as compared to the course of the curve illustrated in FIG. 5A. FIG. 3B further shows that, using the above oscillator according to FIG. 1A, there is a considerably improved frequency/voltage characteristic as a function of the tuning voltage Vtune. This is shown in the frequency voltage characteristic illustrated in FIG. 3B, which has a lower sensitivity in a considerably wider area of the tuning voltage Vtune than the frequency voltage sensitivity of a conventional oscillator circuit illustrated in FIG. 5B.

In order to obtain the characteristic curves illustrated in FIGS. 3A and 3B, an oscillator circuit with a stepped varactor biasing was used, wherein, by way of example, ten voltage steps (i.e. ten partial capacitances) were used for the simulation of the illustrated curves.

Figure 3C:
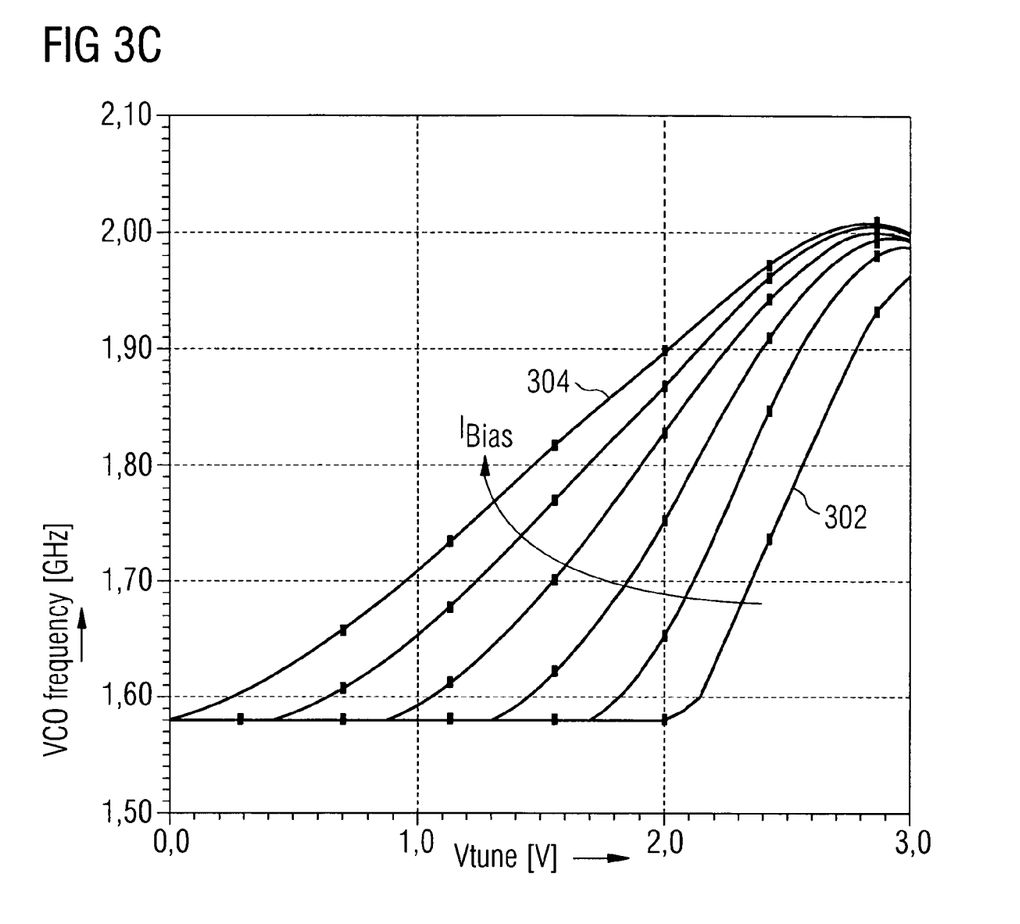

FIG. 3C shows a simulation result of the oscillator circuit according to FIG. 1B with a control for the tuning steepness. Six different bias currents and ten partial capacitances were used. It is apparent that, with a current flow of 0μ ampere, the result is the characteristic tuning curve marked 302, while, with a bias current of 10μ ampere, the result is the characteristic curve marked 304. The illustration in FIG. 3C thus shows that a flattening of the characteristic tuning curve of the oscillator circuit VCO results from an increase of the bias current $I_{bias}$, together with more linearity of the characteristic tuning curve over the voltage area in which the tuning voltage Vtune may be varied.

In order to operate the oscillator circuit described above, it is necessary, as compared to the conventional method, to provide a first bias and a second bias with which the first partial capacitance and the second partial capacitance may be provided. After that, the desired steepness of the characteristic tuning curve may be adjusted. When the oscillator circuit is settled, a voltage dropping at the total capacitance of the oscillator circuit may be tapped off to output the same as output signal of the oscillator circuit.

However, the electronic circuit with variable capacitance in the form of individual partial capacitances shown in the example of the oscillator circuit may also be used for other fields of application. The only thing to be taken into account is that, by the connection of the individual partial capacitances, as set forth above, a total capacitance is achieved which allows a realization of a more linear and flatter characteristic curve of the capacitance of the electronic circuit.

In summary it may thus be said, that switching to several characteristic tuning curves, as is necessary in conventional oscillator circuits, may be avoided when an extension of the active tuning area is performed by means of the inventive approach. For this, the varactor element used in conventional oscillator circuits (i.e. the partial capacitance used in a conventional oscillator circuit) is split into many individual varactors of equal size. These individual varactors, in turn, obtain their own DC bias points (i.e. tap points) in pairs, which differ stepwise by, for example, several hundred mV from each other. The number of pairs and the voltage difference between the bias points determine the length and linearity of the thus generated tuning curve. An example for a realization can be seen in FIG. 1A, a resulting tuning curve was simulated and is illustrated in FIGS. 3A and 3B.

This makes use of the fact that the DC difference voltage across the varactor determines its respective capacitance value. With the difference voltages being stepped, the individual varactor pairs are in different states. By changing the tuning voltage, the difference voltages are shifted all together by the same amount and the varactors pass from one state to the next one after the other. This is because the varactor has three state areas, either its maximum or minimum capacitance (saturation area) and, in-between, the relatively short transition area. By the biasing discussed above, these transition areas are offset against each other so that there is a mutual overlap. When a varactor has left its transition area, its capacitance value remains stable, and the next varactor is in this transition state. In this way, all varactors are successively transferred from the minimum capacitance value Cmin illustrated in FIG. 2 to the maximum capacitance value Cmax (or vice versa), which results in a long total characteristic curve, as illustrated in FIG. 2 (lower part diagram). The frequency of the VCO behaves exactly inversely to the capacitance.

In the example, the biasing is generated via a current source and, for example, a number of equal resistors R. An advantage of this is the matching behaviour in integrated circuits. However, the biasing may also be generated in any other way, the steps may also be selected as desired, and thus it would theoretically be possible to generate any desired characteristic curves.

It further is to be noted that a conventional VCO generally has one or more characteristic tuning curves which have a determined steepness which determines the steepness of the circuit. In most cases, the steepness is abbreviated Kvco and has the unit Hz/V. If it is required to control this steepness in a defined way without changing the tuning area, the oscillator circuit described above is recommended.

It is preferred to use varactor pairs (i.e. partial capacitances) with linearly stepped bias points, as illustrated in FIG. 1B. This arrangement results in an overlap of the capacitance/voltage curves of the individual varactor pairs, as can be seen in FIG. 2B.

A voltage difference between adjacent bias points is ΔU. If this voltage difference is changed, the position of the individual characteristic curves with respect to each other and thus the length of the total characteristic tuning curve and thus also its steepness also change. With a larger ΔU, the characteristic curve becomes flatter, with a smaller ΔU, it becomes steeper up to the maximum steepness at ΔU=0 Volt. This connection is again illustrated in the FIGS. 2B and 3C.

This voltage difference is preferably formed at a resistor with the aid of the bias current $I_{bias}$. If this bias current $I_{bias}$ is variable, i.e. adjustable, the voltage difference ΔU and thus the steepness of the characteristic tuning curve may thus be controlled.

For the entire tuning area to be maintained, it should be ensured that all varactor pairs are completely switched when the tuning voltage Vtune passes through.

The simulation result for such an oscillator circuit is illustrated in FIG. 3C, wherein six different bias currents $I_{bias}$ and ten varactor pairs were used. The maximum tune area is 3 Volts here, but it can be adapted according to the used technology.

Depending on the circumstances, the inventive method for operating a circuit with variable capacitance may be implemented in hardware or in software. The implementation may be performed on a digital storage medium, particularly a floppy disc or CD with control signals that can be read out electronically, which may cooperate with a programmable computer system so that the corresponding method is carried out. Generally, the invention thus also consists in a computer program product with a program code stored on a machine-readable carrier for performing the inventive method, when the computer program product runs on a computer. In other words, the invention may thus be realized as a computer program with a program code for performing the method, when the computer program runs on a computer.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A circuit with variable capacitance comprising:
   a capacitance, wherein the capacitance includes a first partial capacitance and a second partial capacitance connected in parallel to the first partial capacitance, wherein a capacitance value of the first partial capacitance depends on a first bias of the first partial capacitance, and a capacitance value of the second partial capacitance depends on a second bias of the second partial capacitance, wherein the first partial capacitance includes two auxiliary capacitances connected in series with a first tap point in-between, and the second partial capacitance includes two further auxiliary capacitances connected in series with a second tap point in-between, wherein the first bias is defined by a potential difference between the first tap point and a ground potential terminal, and the second bias is defined by a potential difference between the second tap point and the ground potential terminal, wherein the first tap point is electrically connected to a supply voltage terminal of the circuit with variable capacitance, wherein the first tap point is connected to the second tap point via a resistor, wherein the resistor connects the second tap point to the supply voltage terminal in a serial connection via the first tap point; and
   a biasing unit configured to provide the first bias and the second bias, wherein the first bias differs from the second bias.

2. The circuit with variable capacitance according to claim 1, wherein the biasing unit is designed to be able to change a voltage drop over the resistor between the first tap point and the second tap point.

3. The circuit with variable capacitance according to claim 2, wherein the biasing unit is designed to effect a current flow across the resistor.

4. The circuit with variable capacitance according to claim 3, wherein the biasing unit is designed to provide a variable current flow across the resistor.

5. The circuit with variable capacitance according to claim 4, wherein the biasing unit comprises a plurality of auxiliary transistors which are connectable in parallel.

6. The circuit with variable capacitance according to claim 5, wherein the biasing unit further comprises a first auxiliary transistor having a first controlled terminal and a second controlled terminal, and a second auxiliary transistor having a first controlled terminal and a second controlled terminal, wherein the first controlled terminal of the first auxiliary transistor is connected to the first controlled terminal of the second auxiliary transistor and the second tap point, the second controlled terminal of the first auxiliary transistor is connected to the ground potential terminal via a first switch, and the second controlled terminal of the second auxiliary transistor is connected to the ground potential terminal via a second switch.

7. The circuit with variable capacitance according to claim 6, wherein the biasing unit includes a switch control unit designed to controllably close and open the first switch or the second switch.

8. The circuit with variable capacitance according to claim 1, wherein each of the two auxiliary capacitances is formed as a MOS transistor having a gate terminal that serves as a first electrode of the auxiliary capacitance and having a source terminal that serves as a second electrode of the auxiliary capacitance, wherein the source terminal is electrically connected to a drain terminal of the MOS transistor.

9. The circuit with variable capacitance according to claim 1, wherein the circuit with variable capacitance is designed to output a frequency signal voltage controlled via a tuning voltage, wherein the capacitance value of the first partial capacitance and the capacitance value of the second partial capacitance further depends on a tuning voltage, and the circuit with variable capacitance further includes an input for receiving the tuning voltage.

10. The circuit with variable capacitance according to claim 9, wherein the unit for providing the first bias and the second bias is designed to bring the capacitance value of the first partial capacitance into a relationship substantially linearly depending on the tuning voltage, in a partial interval of the tuning voltage, and to bring the capacitance value of the second partial capacitance into a relationship substantially linearly depending on the tuning voltage, in a second partial interval of the tuning voltage, wherein the first partial interval differs from the second partial interval in at least one interval area.

11. The circuit with variable capacitance according to claim 10, wherein the first bias differs from the second bias, and wherein the interval area by which the first partial interval differs from the second partial interval has a length which depends on a difference of the first bias and the second bias.

12. A method for operating a circuit with variable capacitance, the method comprising:
    providing the circuit with variable capacitance, the circuit with variable capacitance including a capacitance, wherein the capacitance comprises a first partial capacitance and a second partial capacitance connected in parallel to the first partial capacitance, wherein a capacitance value of the first partial capacitance depends on a first bias of the first partial capacitance, and a capacitance value of the second partial capacitance depends on a second bias of the second partial capacitance, wherein the first partial capacitance includes two auxiliary capacitances connected in series with a first tap point in-between, and the second partial capacitance includes two further auxiliary capacitances connected in series with a second tap point in-between, wherein the first bias is defined by a potential difference between the first tap point and a ground potential terminal, and the second bias is defined by a potential difference between the second tap point and the ground potential terminal, wherein the first tap point is electrically connected to a supply voltage terminal of the circuit with variable capacitance, wherein the first tap point is connected to the second tap point via a resistor, wherein the resistor connects the second tap point to the supply voltage terminal in a serial connection via the first tap point;

providing the first bias and the second bias by applying a supply voltage to the supply voltage terminal; and tapping off a voltage dropping at the capacitance of the circuit with variable capacitance to output the same as output signal of the circuit with variable capacitance.

13. A computer readable medium containing program code operable to, when run on a computer, perform a method for operating a circuit with variable capacitance, wherein the circuit with variable capacitance includes a capacitance, wherein the capacitance comprises a first partial capacitance and a second partial capacitance connected in parallel to the first partial capacitance, wherein a capacitance value of the first partial capacitance depends on a first bias of the first partial capacitance, and a capacitance value of the second partial capacitance depends on a second bias of the second partial capacitance, wherein the first partial capacitance includes two auxiliary capacitances connected in series with a first tap point in-between, and the second partial capacitance includes two further auxiliary capacitances connected in series with a second tap point in-between, wherein the first bias is defined by a potential difference between the first tap point and a ground potential terminal, and the second bias is defined by a potential difference between the second tap point and the ground potential terminal, wherein the first tap point is electrically connected to a supply voltage terminal of the circuit with variable capacitance, wherein the first tap point is connected to the second tap point via a resistor, wherein the resistor connects the second tap point to the supply voltage terminal in a serial connection via the first tap point, the method comprising:

providing the first bias and the second bias by applying a supply voltage to the supply voltage terminal; and tapping off a voltage dropping at the capacitance of the circuit with variable capacitance to output the same as output signal of the circuit with variable capacitance.

14. An oscillator circuit comprising:

an inductance;

a capacitance connectable in series to the inductance, wherein the capacitance includes a first partial capacitance and a second partial capacitance connected in parallel to the first partial capacitance, wherein a capacitance value of the first partial capacitance depends on a first bias of the first partial capacitance, and a capacitance value of the second partial capacitance depends on a second bias of the second partial capacitance, wherein the first partial capacitance includes two auxiliary capacitances connected in series with a first tap point in-between, and the second partial capacitance includes two further auxiliary capacitances connected in series with a second tap point in-between, wherein the first tap point is electrically connected to a supply voltage terminal of the oscillator circuit, wherein the first tap point is connected to the second tap point via a resistor, wherein the resistor connects the second tap point to the supply voltage terminal in a serial connection via the first tap point; and a biasing unit configured to provide the first bias and the second bias.

15. The oscillator circuit according to claim 14, wherein the first bias is defined by a potential difference between the first tap point and a ground potential terminal, and the second bias is defined by a potential difference between the second tap point and the ground potential terminal.

16. The oscillator circuit according to claim 14, wherein the first bias differs from the second bias.

17. The oscillator circuit according to claim 14, wherein the biasing unit is designed to be able to change a voltage drop at the resistor between the first tap point and the second tap point.

18. The oscillator circuit according to claim 14, wherein the biasing unit is designed to effect a current flow across the resistor.

19. The oscillator circuit according to claim 18, wherein the biasing unit is designed to provide a variable current flow across the resistor.

20. The oscillator circuit according to claim 19, wherein the biasing unit comprises a plurality of auxiliary transistors which are connectable in parallel.

21. The oscillator circuit according to claim 20, wherein the biasing unit further comprises a first auxiliary transistor having a first controlled terminal and a second controlled terminal, and a second auxiliary transistor having a first controlled terminal and a second controlled terminal, wherein the first controlled terminal of the first auxiliary transistor is connected to the first controlled terminal of the second auxiliary transistor and the second tap point, the second controlled terminal of the first auxiliary transistor is connected to the ground potential terminal via a first switch, and the second controlled terminal of the second auxiliary transistor is connected to the ground potential terminal via a second switch.

22. The oscillator circuit according to claim 21, wherein the biasing unit includes a switch control unit designed to controllably close and open the first switch or the second switch.

23. The oscillator circuit according to claim 15, wherein each of the two auxiliary capacitances is formed as a MOS transistor having a gate terminal that serves as a first electrode of the auxiliary capacitance and having a source terminal that serves as a second electrode of the auxiliary capacitance, wherein the source terminal is electrically connected to a drain terminal of the MOS transistor.

24. The oscillator circuit according to claim 14, wherein the oscillator circuit is designed to output a frequency signal voltage controlled via a tuning voltage, wherein the capacitance value of the first partial capacitance and the capacitance value of the second partial capacitance further depends on a tuning voltage, and the oscillator circuit further includes an input for receiving the tuning voltage.

25. The oscillator circuit according to claim 24, wherein the unit for providing the first bias and the second bias is designed to bring the capacitance value of the first partial capacitance into a relationship substantially linearly depending on the tuning voltage, in a partial interval of the tuning voltage, and to bring the capacitance value of the second partial capacitance into a relationship substantially linearly depending on the tuning voltage, in a second partial interval of the tuning voltage, wherein the first partial interval differs from the second partial interval in at least one interval area.

26. The oscillator circuit according to claim 25, wherein the first bias differs from the second bias, and wherein the interval area by which the first partial interval differs from the second partial interval has a length which depends on a difference of the first bias and the second bias.

27. A method for operating an oscillator circuit, the method comprising:

providing the oscillator circuit, wherein the oscillator circuit includes an inductance, a capacitance connectable in series to the inductance, wherein the capacitance comprises a first partial capacitance and a second partial capacitance connected in parallel to the first partial capacitance, wherein a capacitance value of the first partial capacitance depends on a first bias of the first partial capacitance, and a capacitance value of the second partial capacitance depends on a second bias of the second partial capacitance, wherein the first partial capacitance includes two auxiliary capacitances connected in series with a first tap point in-between, and the second partial capacitance includes two further auxiliary capacitances connected in series with a second tap point in-between, wherein the first tap point is electrically connected to a supply voltage terminal of the oscillator circuit, wherein the first tap point is connected to the second tap point via a resistor, wherein the resistor connects the second tap point to the supply voltage terminal in a serial connection via the first tap point;

providing the first bias and the second bias by applying a supply voltage to the supply voltage terminal; and tapping off a voltage dropping at the capacitance of the oscillator circuit to output the same as output signal of the oscillator circuit.

28. A computer readable medium containing a computer program with program code, the program code operable to, when run on a computer, perform a method for operating an oscillator circuit, wherein the oscillator circuit includes an inductance, a capacitance connectable in series to the inductance, wherein the capacitance comprises a first partial capacitance and a second partial capacitance connected in parallel to the first partial capacitance, wherein a capacitance value of the first partial capacitance depends on a first bias of the first partial capacitance, and a capacitance value of the second partial capacitance depends on a second bias of the second partial capacitance, wherein the first partial capacitance includes two auxiliary capacitances connected in series with a first tap point in-between, and the second partial capacitance includes two further auxiliary capacitances connected in series with a second tap point in-between, wherein the first tap point is electrically connected to a supply voltage terminal of the oscillator circuit, wherein the first tap point is connected to the second tap point via a resistor, wherein the resistor connects the second tap point to the supply voltage terminal in a serial connection via the first tap point, the method comprising: providing the first bias and the second bias by applying a supply voltage to the supply voltage terminal; and tapping off a voltage dropping at the capacitance of the oscillator circuit to output the same as output signal of the oscillator circuit.

* * * * *